United States Patent
Saitoh

(10) Patent No.: US 6,731,115 B2
(45) Date of Patent: May 4, 2004

(54) INTEGRATED GAS-INSULATED SWITCHGEAR WITH CURRENT TRANSDUCER SYSTEM

(75) Inventor: Minoru Saitoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 09/986,276

(22) Filed: Nov. 8, 2001

(65) Prior Publication Data

US 2002/0053911 A1 May 9, 2002

(30) Foreign Application Priority Data

Nov. 8, 2000 (JP) .................................... 2000-341100

(51) Int. Cl.⁷ ............................................. G01R 33/00
(52) U.S. Cl. ..................................................... 324/424
(58) Field of Search ........................... 324/117 R, 415, 324/514, 87, 127, 424, 158.1; 307/48; 361/116, 120, 114, 115

(56) References Cited

U.S. PATENT DOCUMENTS 5,796,060 A * 8/1998 Fuchsle et al. ............... 218/79
6,057,678 A * 5/2000 Tagiri et al. ................. 324/96

\* cited by examiner

*Primary Examiner*—Evan Pert
*Assistant Examiner*—Trung Q. Nguyen
(74) *Attorney, Agent, or Firm*—Oblon, Spivak, McClelland, Maier & Neustadt, P.C.

(57) ABSTRACT

A current transducer system for measuring AC current in a high-voltage main circuit having a circuit breaker and a disconnecting switch in an integrated gas-insulated switchgear. The system comprises a current sensor for detecting the AC current and outputting an analog electric signal representing the AC current, the current sensor disposed near the circuit breaker. The system further comprises a sensor unit including an analog-to-digital converter for converting the analog electric signal to a digital electric signal, and an electric-to-optic converter for converting the digital electric signal to a digital optic signal, the sensor unit disposed near the circuit breaker. The system further comprises optic transmission means for transmitting the digital optic signal.

19 Claims, 13 Drawing Sheets

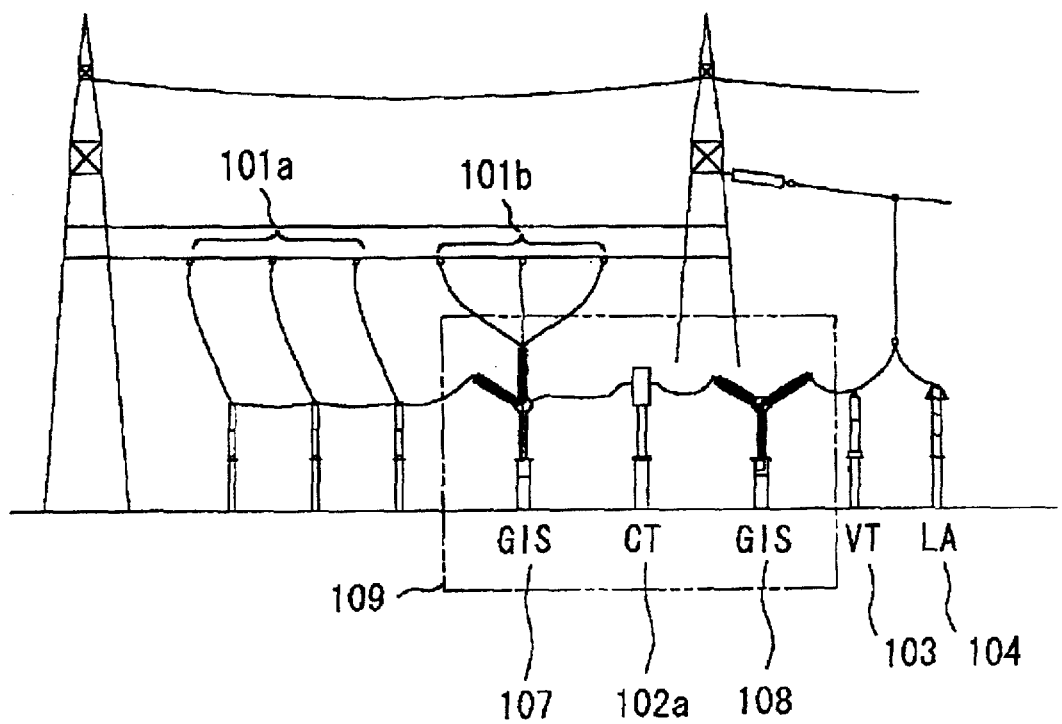
F I G. 3

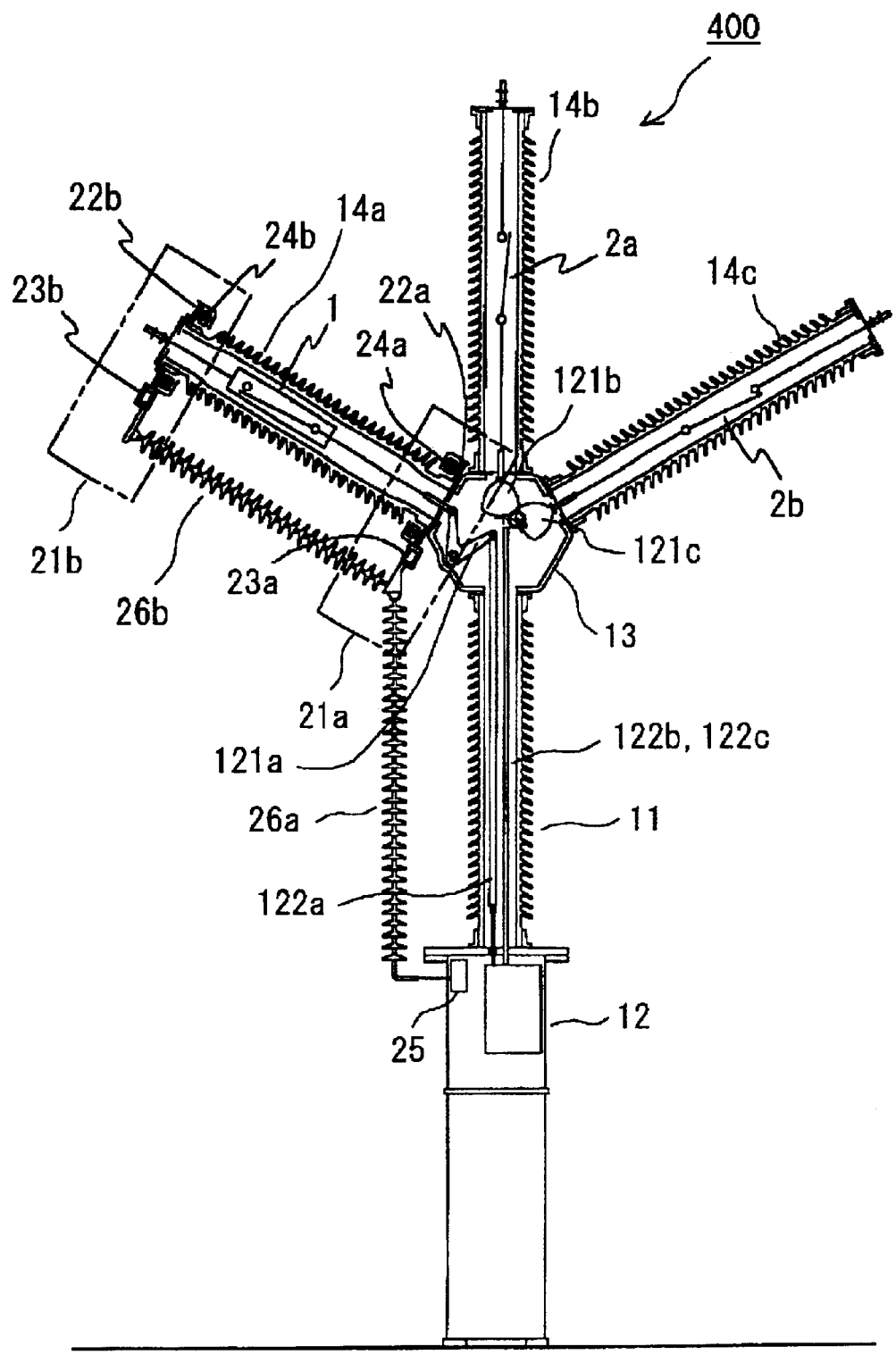
F I G. 10

INTEGRATED GAS-INSULATED SWITCHGEAR WITH CURRENT TRANSDUCER SYSTEM

CROSS-REFERENCE TO RELATED APPLICATIONS

This application is based upon and claims the benefit of priority from the prior Japanese Patent Application No. 2000-341100, filed on Nov. 8, 2000; the entire contents of which are incorporated herein by reference.

BACKGROUND OF THE INVENTION

This invention is related to a current transducer (CT) system for measuring high-voltage main circuit AC current in a gas-insulated switchgear (GIS) for AC power supply system, the switchgear with the current transducer system and a method for measuring the AC current.

In general air-insulated substations, switchgears are sometimes replaced by new ones, while busbars and steel towers are rarely replaced since their life spans are relatively long. Therefore, in most replacement works, the switchgears are replaced by new ones of higher performance and higher reliability utilizing installed older air-insulated busbars. For those purposes, some integrated gas-insulated switchgears have been proposed.

Referring to FIGS. 1 and 2, typical line bay construction of an air-insulated substation of double busbar scheme of the prior art is described now. The air-insulated substation has a circuit breaker (CB) 1 which is connected to busbars 101a and 101b via bus side disconnecting switches (DSs) 2a and 2b, respectively. The substation also has a pair of current transformers 102a and 102b on both sides of the circuit breaker 1. The substation also has a line side disconnecting switch 2c, an instrument transformer (or a voltage transformer: VT) 103 and a lightning arrester (LA) 104.

Those components of the substation are supported on insulating supporting structures. The output AC current is sent out of the substation through over-head lines (OHLs) 130. The current transformers 102a and 102b are typically of oil-filled insulator types.

FIG. 3 shows an exemplary construction of components of a conventional substation replaced with new integrated gas-insulated switchgears and conventional current transformers. The component groups surrounded by dot-dash lines 105 and 106 shown in FIG. 1 might be replaced by integrated gas-insulated switchgears 107 and 108, respectively, as shown in FIG. 3.

The component group surrounded by a dot-dash line 109 shown in FIG. 3 is now described referring to FIG. 4. The integrated gas-insulated switchgear 107 may have a metal box 13a containing a driving connector 121e. The metal box 13a may be supported by and disposed on top end of a vertically standing supporting hollow insulator 11a.

An operation device 12a may be disposed at the bottom end of the supporting hollow insulator 11a. Hollow insulators 14e and 14f may be supported by the metal box 13a on their ends and contain the disconnecting switches 2a and 2b, respectively. The disconnecting switches 2a and 2b may be operable by the operation device 12a via the driving connector 121e.

Likewise, the integrated gas-insulated switchgear 108 may have a metal box 13b containing a driving connector 121. The metal box 13b may be supported by and disposed on top end of a vertically standing supporting hollow insulator 11b. An operation device 12b may be disposed at the bottom end of the supporting hollow insulator 11b.

Hollow insulators 14a and 14c may be supported by the metal box 13b on their ends and contain the circuit breaker 1 and the disconnecting switch 2c, respectively. The circuit breaker 1 and the disconnecting switch 2c may be operable by the operation device 12b via the driving connector 121.

The disconnecting switches 2a and 2b, the circuit breaker 1 and the disconnecting switch 2c may be electrically connected each other in series in the metal boxes 13a and 13b, respectively.

Thus, the components surrounded by the dot-dash line 105 shown in FIG. 1 would be replaced by the integrated gas-insulated switchgear 107 having the two disconnecting switches 2a and 2b, and the components surrounded by the dot-dash line 106 would be replaced by the integrated gas-insulated switchgear 108 having the circuit breaker 1 and the disconnecting switch 2c as shown in FIGS. 3 and 4.

Now replacement of current transformers is discussed. The line side current transformer 102b shown in FIGS. 1 and 2 can be replaced by a penetrating-type current transducer, which is of the same type used in conventional gas-insulated switchgears, in the integrated gas-insulated switchgear if the line-side (e.g. the metal box 13b shown in FIG. 4) is grounded. However, the bus side current transformer 102a shown in FIG. 1 cannot be replaced by a penetrating-type current transducer for either of the integrated gas-insulated switchgears 107 or 108 shown in FIG. 4, since the replaced current transformer would be on the high-voltage side.

Therefore, oil-filled insulator type current transformers must be used. Thus, if the air-insulated substation shown in FIG. 1 is replaced with an integrated gas-insulated switchgear shown in FIG. 3, the current transformers used there would be a combination of current transformers of oil-filled insulator-type and of penetrating-type.

General line bay construction of air-insulated substation of double busbar scheme have been discussed, whereas combination of oil-filled insulator-type current transformers and penetration-type current transformers may have to be utilized in other facilities such as bus section or bus coupler constructions, line bay constructions of single busbar scheme substations, line bay constructions of one and half busbar scheme substations, and so on.

As discussed above, a penetration-type current transformer which is generally used in conventional gas-insulated switchgears cannot be disposed at the high-voltage side for the integrated gas-insulated switchgear 108 shown in FIG. 4 due to the insulation difficulty, so that the circuit breaker cannot have current transformers on its both sides. Therefore, in practice, disposing current transformer on one side of the circuit breaker may be omitted, or an independent oil-filled insulator-type current transformer may be installed if current transformers on both sides of the circuit breaker would be necessary.

Oil-filled insulator-type current transformers themselves are expensive, and would require extra area and ground construction for setting up, which would spoil the advantage of reduced required area for substations and the total cost-down which would be generally obtained by applying integrated gas-insulated switchgears.

In addition, in an oil-filled insulator-type current transformers, internal burnout accident could cause increased pressure in the tank which could develop into a severe accident with a tank explosion. Therefore, the oil-filled insulator-type current transducers would be demanded to be replaced by penetrating-type current transformers when the substations are replaced.

However, the penetrating-type current transformers used in conventional gas-insulated switchgears with analog current output, the rated secondary output of which may be 1 Ampere or 5 Amperes, can be installed only in ground voltage side, and cannot be disposed on both sides of the circuit breaker of integrated gas-insulated switchgears such as the ones shown in FIG. 3.

BRIEF SUMMARY OF THE INVENTION

Accordingly, it is an object of the present invention to provide an improved current transformer which can be disposed on either side of the circuit breaker of an integrated gas-insulated switchgear.

There has been provided, in accordance with an aspect of the present invention, a current transducer system for measuring AC current in a high-voltage main circuit having a circuit breaker and a disconnecting switch in an integrated gas-insulated switchgear, the system comprising: a current sensor for detecting the AC current and outputting an analog electric signal representing the AC current, the current sensor disposed near the circuit breaker; a sensor unit including an analog-to-digital converter for converting the analog electric signal to a digital electric signal, and an electric-to-optic converter for converting the digital electric signal to a digital optic signal, the sensor unit disposed near the circuit breaker; and optic transmission means for transmitting the digital optic signal.

There has also been provided, in accordance with another aspect of the present invention, an integrated gas-insulated switchgear for switching on and off an AC current in a high-voltage main circuit, the switchgear comprising: (1) a container filled with insulating gas; (2) a circuit breaker and a disconnecting switch contained in the container, the circuit breaker and the disconnecting switch being connected in series each other; and (3) a current transducer system for measuring the AC current in the high-voltage main circuit, the current transducer system including: a current sensor for detecting the AC current and outputting an analog electric signal representing the AC current, the current sensor disposed near the circuit breaker; a sensor unit including an analog-to-digital converter for converting the analog electric signal to a digital electric signal, and an electric-to-optic converter for converting the digital electric signal to a digital optic signal, the sensor unit disposed near the circuit breaker; and optic transmission means for transmitting the digital optic signal.

There has also been provided, in accordance with yet another aspect of the present invention, a method for measuring AC current in a high-voltage main circuit having a circuit breaker and a disconnecting switch in an integrated gas-insulated switchgear, the method comprising steps of: detecting the AC current and outputting an analog electric signal representing the AC current near the circuit breaker; converting the analog electric signal to a digital electric signal and converting the digital electric signal to a digital optic signal near the circuit breaker; and transmitting the digital optic signal.

There has also been provided, in accordance with yet another aspect of the present invention, a current transducer system for measuring AC current in a high-voltage main circuit having a circuit breaker and a disconnecting switch in an integrated gas-insulated switchgear, the system comprising: a current transducer for detecting the AC current and outputting an optic signal representing the AC current, the current transducer disposed near the circuit breaker; and optic transmission means for transmitting the optic signal.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which:

FIG. 3 is a schematic elevational view of the substation shown in FIG. 1 replaced with new integrated gas-insulated switchgears and a conventional current transformer;

FIG. 10 is a schematic elevational cross-sectional view of a second embodiment of a gas-insulated switchgear according to the present invention;

DETAILED DESCRIPTION OF THE INVENTION

Figure 1:
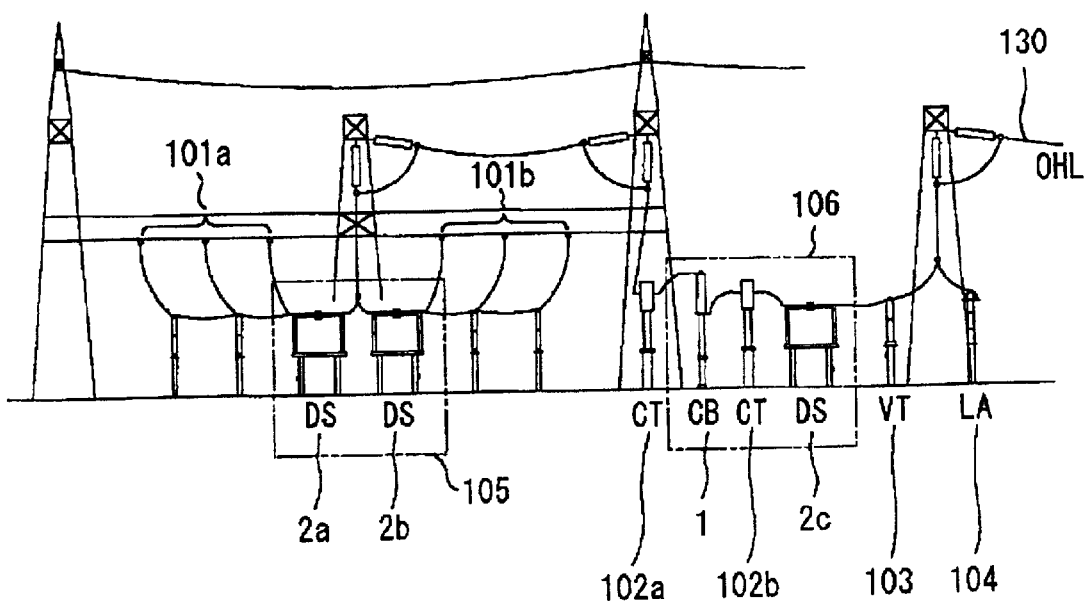
FIG. 1 is a schematic elevational view of a typical air-insulated substation of double busbar scheme of prior art.
Figure 2:
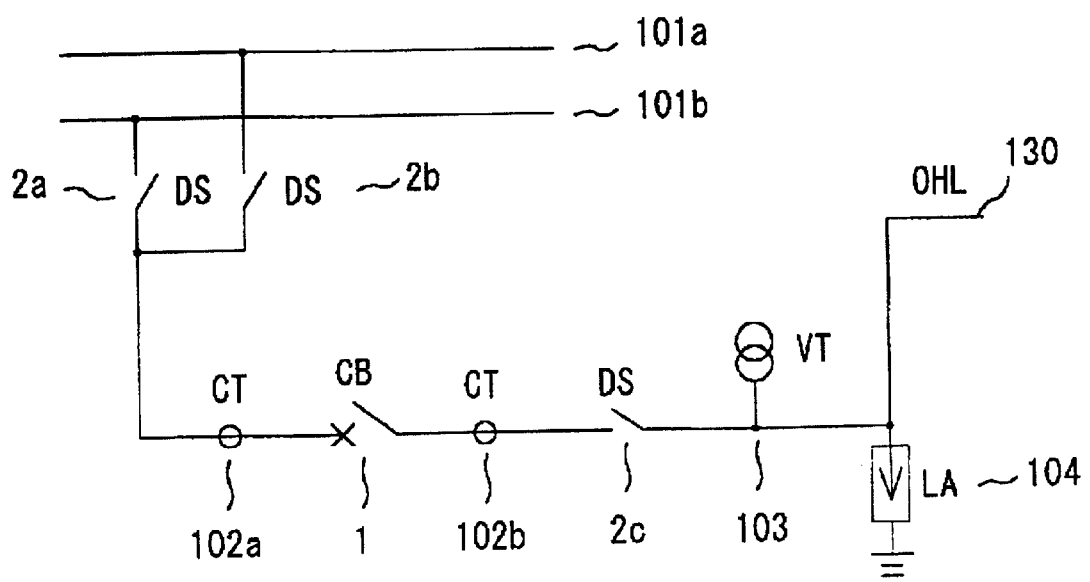
FIG. 2 is a single line diagram of the substation shown in FIG. 1.

In the following description and also in the above description of background of the invention, like reference numerals represent like elements, and redundant description may be omitted.

[First Embodiment]

Figure 5:
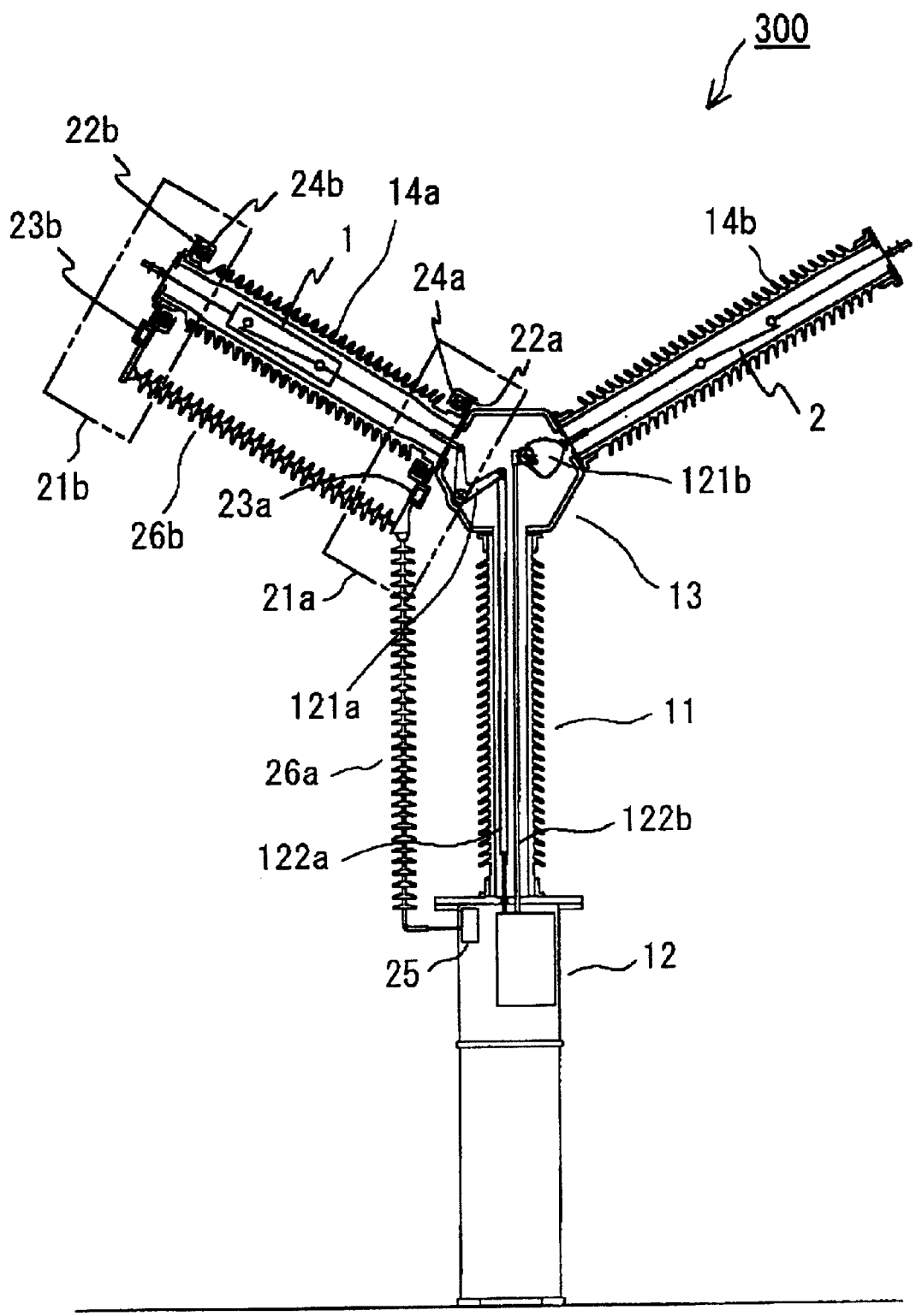
FIG. 5 is a schematic elevational cross-sectional view of a first embodiment of a gas-insulated switchgear according to the present invention.

A first embodiment of an integrated gas-insulated switchgear with a current transducer system according to the present invention is now described with reference to FIGS. 5 through 9. Referring to FIG. 5, the first embodiment of an integrated gas-insulated switchgear 300 has a straight vertical cylindrical supporting hollow insulator 11 and an operation device 12 at the bottom of the supporting hollow insulator 11.

A metal box 13 is fixed on the top of the supporting hollow insulator 11, to which first and second straight hollow insulators 14a and 14b, respectively, are attached so that the supporting hollow insulator 11 and the two hollow insulators 14a and 14b may form a "Y" shape. The first and second hollow insulators 14a and 14b contain a circuit breaker 1 and a disconnecting switch 2, respectively, which are electrically connected in series in the box 13.

The box 13 contains actuating connectors 121a and 121b which are connected to the operation device 12 via operation rods 122a and 122b, respectively, penetrating the supporting insulator 11. The contact points of the circuit breaker 1 and the disconnecting switch 2 can be switched on and off separately by the operation device 12 via the operation rods 122a and 122b.

Current transducers 21a and 21b are attached on both ends of the first hollow insulator 14a containing the circuit breaker 1. The current transducers 21a and 21b have current detecting means 22a and 22b, sensor units (SUs) 23a and 23b, and power supply transformers 24a and 24b, respectively. A merging unit (MU) 25, which is connected to the sensor units 23a and 23b with optical fibers contained in insulator tubes 26a and 26b, is disposed beside the operation device 12.

Each of the current detecting means 22a and 22b may be "a Rogowski coil" including an insulator core and a coil, or an air-core coil, in principle of electric-magnetic coupling, or alternatively, a low-power CT with iron core including an iron core, a coil and a current-detection resistor, in principle of electric-magnetic coupling (not shown). The former is supposed to be utilized in this embodiment if otherwise speculated below.

Figure 6:
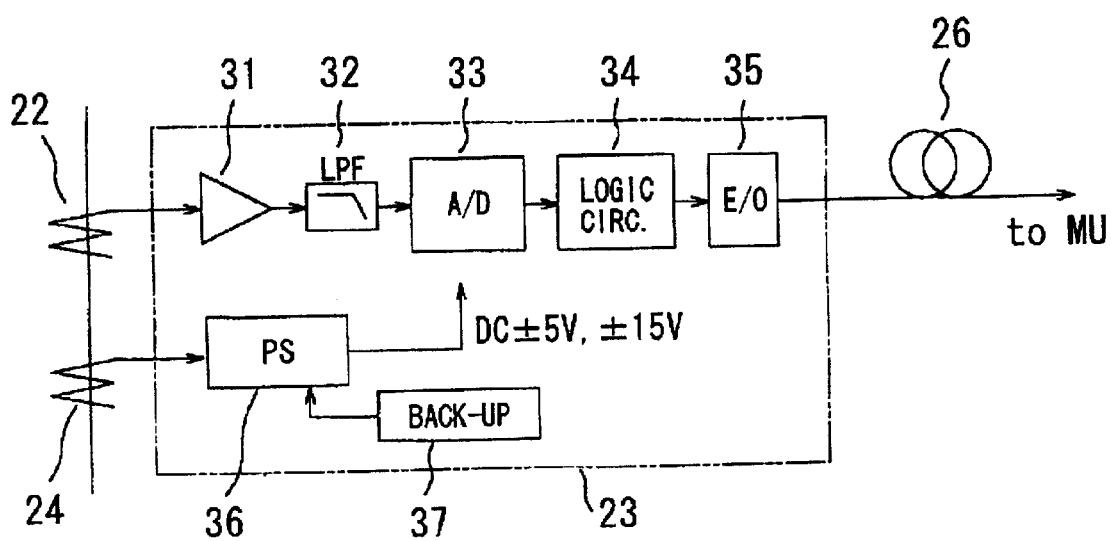
FIG. 6 is a block diagram of the sensor unit shown in FIG. 5.

Referring to FIG. 6, a sensor unit 23 is shown representing the sensor units 23a or 23b. The sensor unit 23 processes the detected data inputted from the current detecting means 22, and comprises an integration circuit 31, a low-pass filter (LPF) 32, an analog-to-digital (A/D) converter 33, a logic circuit 34, an electric-to-optic (E/O) converter 35, an electric power supply circuit 36 and a back-up power supply device 37.

The electric power supply circuit 36 receives electric power from a power supply transformer 24 which is representing the power supply transformers 24a and 24b shown in FIG. 5, and generates voltages of DC ±5V and DC ±15V, for example, required by the sensor unit 23. The back-up power supply device 37 may be a capacitance or, alternatively, a secondary battery which are re-chargeable. If a low-power CT with iron core is utilized as the current detection means 22, the integration circuit 31 shown in FIG. 6 would be replaced by a pre-amplifying circuit.

Figure 7:
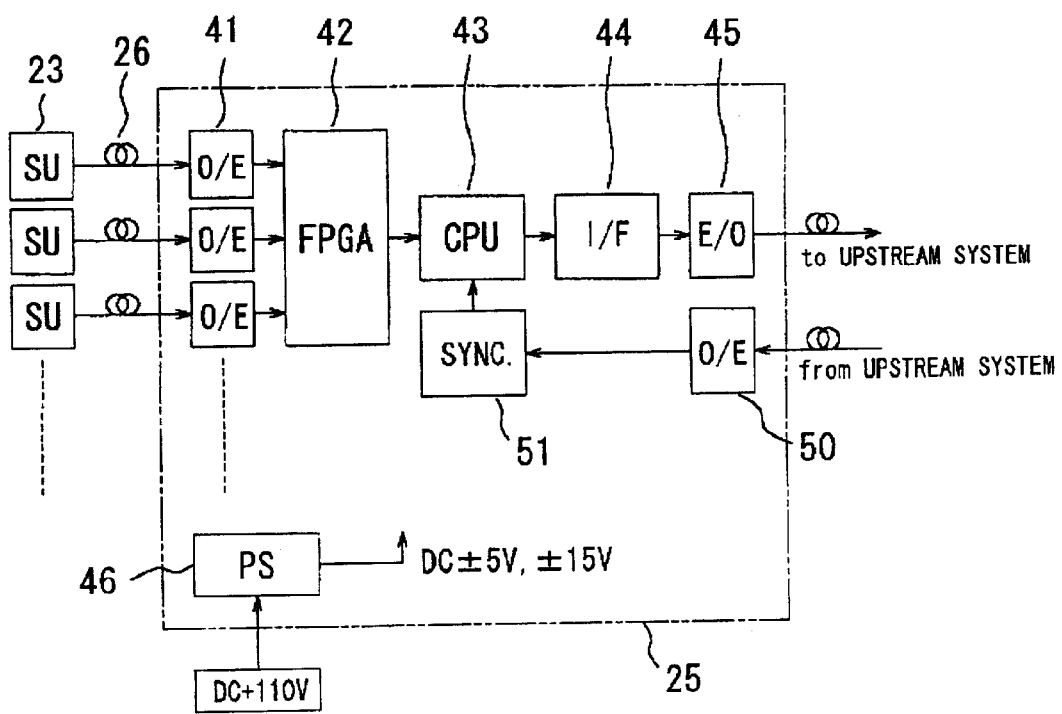
FIG. 7 is a block diagram of the merging unit shown in FIG. 5.

Referring to FIG. 7, the merging unit 25 is now described. The merging unit 25 comprises a plurality of optic-to-electric (O/E) converters 41 for receiving the optic signals from the sensor units 23 via optical fibers 26 and converting the optic signals to electric signals. The merging unit 25 further comprises a field programmable gate array (FPGA) 42, a central processing unit (CPU) 43, an interface (I/F) circuit 44, an electric-to-optic (E/O) converter 45, an electric power supply circuit 46, an optic-to-electric (O/E) converter 50 and a synchronizing circuit 51.

The electric power supply circuit 46 may receive power supply of DC 110V, for example, and generates voltages of DC ±5V and DC ±15V, for example, required by the merging unit 25. The merging unit 25 may also comprise a back-up power supply device (not shown).

The single merging unit may merge signals from the sensor units 23 relating to a same phase, or may merge signals from the sensor units 23 relating to a same bay, or may merge signals from the sensor units 23 relating to a same protection and control unit depending on the lay-out of the substation.

Figure 8:
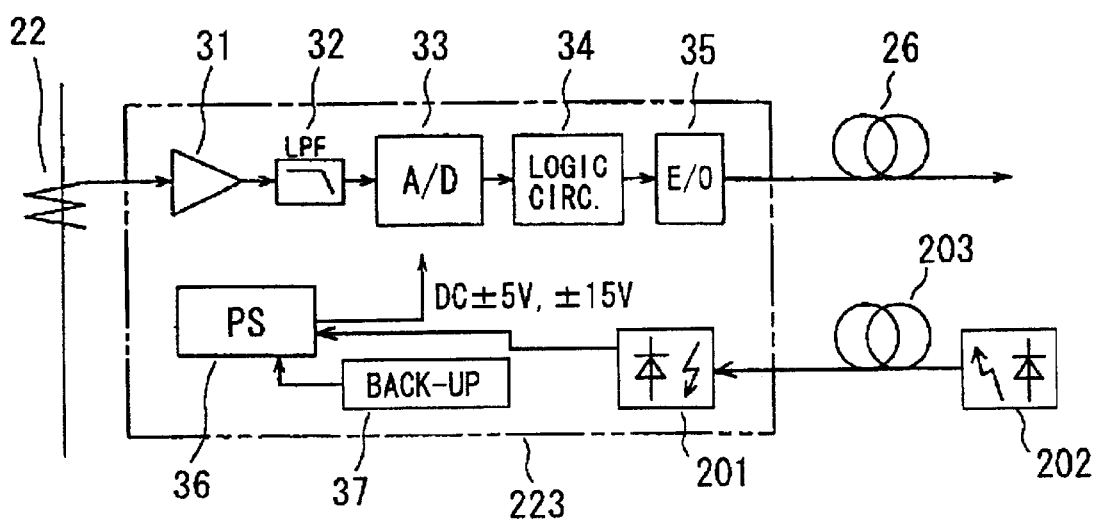
FIG. 8 is a block diagram of the sensor unit as an alternative to that shown in FIG. 6.

The power supply transformers 24a and 24b or 24 shown in FIGS. 5 and 6 as power supplying means for the sensor units can be replaced by photo voltaic power modules as alternatives. FIG. 8 shows an alternative sensor unit 223 which can be replaced for the sensor unit 23 shown in FIG. 6.

The sensor unit 223 has a photo voltaic power module 201 which converts optic power to electric power. The photo voltaic power module 201 is connected to the electric power supply circuit 36. A Laser diode 202 is disposed beside the operation device 12 (See FIG. 5), and the Laser diode 202 and the photo voltaic power module 201 are connected each other with an optical fiber contained in an insulator tube 203.

Optic power is sent from the Laser diode 202 via the optical fiber 203 to the photo voltaic power module 201. Optic power is converted to electric power by the photo voltaic power module 201, and thus the electric power is supplied to the electric power supply circuit 36. The other features of the sensor unit 223 are similar to those of the sensor unit 23, and further description is omitted.

Current transducers 21a and 21b may be disposed on both sides of the circuit breaker 1 as shown in FIG. 5, but alternatively, one of the transformers can be omitted. When the current transducer 21b which is further from the metal box 13 is omitted and the metal box 13 is grounded, the optical fiber between the sensor unit 23a and the metal box 13 can be a conventional optical fiber cable with a protective tube without a hollow insulator.

Referring again to FIG. 6, in operation of the first embodiment of the current transducer system described above, the current detecting means 22 outputs an electric signal representing the high-voltage main circuit current to the sensor unit 23. The electric signal representing the high-voltage main circuit current is integrated by the integration circuit 31, and then high frequency component is cut out by the low-pass filter 32.

Then, a digital electric signal representing the high-voltage main circuit current is generated by the analog-to-digital converter 33. Then, the digital signal representing the high-voltage main circuit current is formed in a series of transmission frames by the logic circuit 34, and the output of the logic circuit 34 is converted to a digital optic signal by the electric-to-optic converter 35. Then, the digital optic signal is sent to the merging unit 25 via the optical fibers in the hollow insulators 26.

Referring again to FIG. 7, in the merging unit 25, the digital optic signals are received at the plurality of optic-to-electric converters 41 from a plurality of sensor units 23 via the optical fibers 26. Then, the digital electric signals are merged and formed in a series of transmission frames by the FPGA 42 and the CPU 43. Then, the merged digital electric signal is sent to the electric-to-optic converter 45 via the interface circuit 44 by which the merged digital electric signal is converted to a digital optic signal. The digital optic signal is then sent to the up-stream system including protective relays (not shown).

The optic-to-electric converter 50 receives an optic synchronizing signal from the upper system and converts it to an electric signal which is sent to the CPU 43 via the synchronizing circuit 51. The CPU 43 has functions of synchronized interpolation of digital signals from the sensor units 23, adding time stamps, sensitivity correction and phase correction.

Alternatively, the synchronizing signal may be sent to the sensor units 23 in stead of the merger unit 25, then the sampling synchronization may be conducted when the analog-to-digital conversions are conducted in the sensor units 23.

According to the first embodiment of the current transducer system described above, following advantages are obtained:

Since the output signals of the current transducers are optic signals and the current transducers are connected to the upstream units via optical fibers, the current transducers can be electrically completely isolated from the upstream units on the ground potential.

Figure 4:
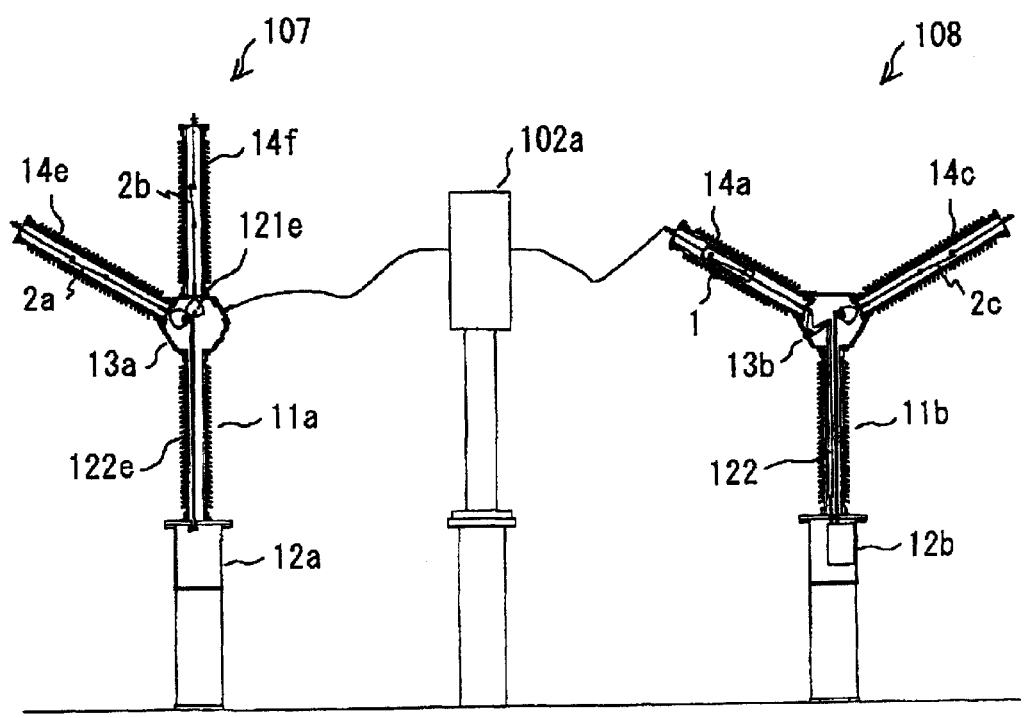
FIG. 4 is an enlarged schematic elevational view of the replaced portion of the substation shown in FIG. 3.
Figure 9:
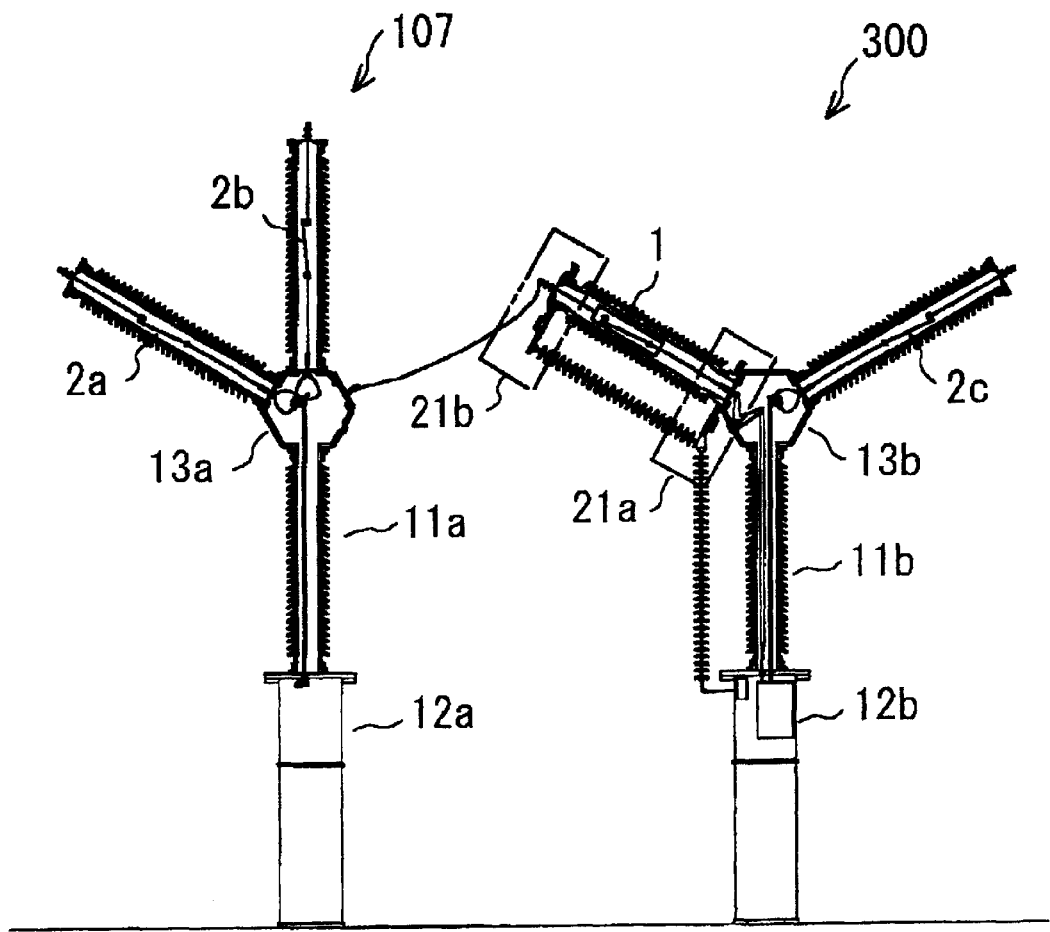
FIG. 9 is a schematic elevational cross-sectional view of a part of a substation replaced with the gas-insulated switchgear shown in FIG. 5.

For example, when the line bay construction of the air-insulated substation shown in FIG. 1 are replaced by integrated gas-insulated switchgears and the current transducers of the present invention, the portion of the substation corresponding to the portion shown in FIG. 4 becomes more compact as shown in FIG. 9. A separate oil-filled current transducer 102a shown in FIG. 4 is not needed although the current transducers 21a and 21b are disposed on both sides of the circuit breaker 1 as shown in FIG. 9, which results in smaller construction area of the substation and total cost-down.

In addition, since the output of the current detecting means 22 is converted to a digital optic signal in the sensor unit 23 disposed near the circuit breaker 1 and sent to the up-stream system as an optic signal, a high quality signal representing the high-voltage main circuit current with low noise can be supplied to the up-stream system even when the output of the current detecting means 22 is small.

Especially, since the sensor unit 23 described above does not require large burden on the current detecting means 22, the output power of the current detecting means 22 can be small. Therefore, the current detecting means 22 can be compact, and designing flexibility of the integrated gas-insulated switchgear can be improved.

In addition, the optical fiber 26 for sending the digital optic signal from the sensor unit 23 is not inserted into or integrated in the hollow insulators 14a or 11 of the main body of the gas-insulated switchgear. Therefore, it is easy to remove the optical fiber 26 and the current transducer 21 including the current detecting means 22 and the sensor unit 23 from the main body of the gas-insulated switchgear.

For example, when the hollow insulator 14a containing the circuit breaker 1 is required to be removed for inspection and maintenance of the circuit breaker 1, the optical fiber 26 can be removed first, and then, the hollow insulator 14a can be removed easily. Besides, the optical fiber 26 can be easily removed and replaced when the optical fiber 26 has been deteriorated for aging.

In addition, the outputs of the current transducers, each of which includes a current detecting means and a sensor unit are merged in the merging unit 25 into one or a few merged signals and sent to the up-stream system with one or a few cables. Therefore, the number of required cables and the time and cost required for installation of the cables can be drastically reduced.

[Second Embodiment]

A second embodiment of an integrated gas-insulated switchgear with a current transducer system according to the present invention is now described with reference to FIG. 10. In this embodiment, an integrated gas-insulated switchgear 400 has a supporting hollow insulator 11 and an operation device 12 at the bottom of the supporting hollow insulator 11. A metal box 13 is fixed on the top of the supporting hollow insulator 11, to which first, second and third straight hollow insulators 14a, 14b and 14c respectively, are attached in a star shape.

The first, second and third hollow insulators 14a, 14b and 14c contain a circuit breaker 1, a first disconnecting switch 2a and a second disconnecting switch 2b, respectively. The circuit breaker 1, and the first and second disconnecting switches 2a and 2b are respectively electrically connected in series in the box 13. The box 13 contains actuating connectors 121a, 121b and 121c which are connected to the operation device 12 via operation rods 122a, 122b and 122c, respectively, penetrating the supporting hollow insulator 11. The contact points of the circuit breaker 1 and the first and second disconnecting switches 2a and 2b can be switched on and off separately by the operation device 12.

Current transducers 21a and 21b are attached on both ends of the first hollow insulator 14a containing the circuit breaker 1. The current transducers 21a and 21b have current detecting means 22a and 22b, sensor units 23a and 23b, and power supply transformers 24a and 24b, respectively. A merging unit 25, which is connected to the sensor units 23a and 23b with optical fibers contained in insulator tubes 26a and 26b, is disposed besides the operation device 12. The features of the current transducers 21a and 21b, the sensor units 23a and 23b, the merging unit 25 and the optical fibers contained in insulator tubes 26a and 26b are same as those of the first embodiment described above, respectively.

According to this embodiment, the current transducer system can be applied to an integrated gas-insulated switchgear having one circuit-breaker 1 and two disconnecting switches 2a and 2b arranged in a star shape, and the same advantages are obtained in this embodiment as in the first embodiment.

[Third Embodiment]

A third embodiment of an integrated gas-insulated switchgear with a current transducer system according to the present invention is now described with reference to FIG. 11. In this embodiment, an integrated gas-insulated switchgear 500 has a first grounded container 15a supported by a supporting structure 17.

The container 15a has first and second straight pipe portions 501 and 502, respectively, which are crossed and connected each other near their lower ends. The first pipe portion 501 is inclined. A first straight hollow insulator 14a which is similar to the hollow insulator 14a, shown in FIG. 5, is connected to the top end of the first pipe portion 501. An operation device 12 similar to the operation device 12 shown in FIG. 5 is disposed at the bottom end of the first pipe portion 501. The first hollow insulator 14a contains a circuit breaker 1.

The second pipe portion 502 of the first grounded container 15a is vertically arranged, and is connected to a second grounded container 15b on the top end of the second pipe portion 502. A disconnecting switch 2 and an earthing switch 3 are disposed in the second grounded container 15b. A bushing 16 with a second hollow insulator 14b is connected to the top end of the second grounded container 15b.

The first and second grounded containers 15a and 15b, the first and second hollow insulators 14a and 14b are filled with insulation gas. The gas filled spaces in the first hollow insulator 14a and the first grounded container 15a are divided by a first insulating spacer 153a. The gas filled spaces in the second grounded container 15b and the first grounded container 15a are divided by a second insulating spacer 153b.

The circuit breaker 1, the disconnecting switch 2 and the earthing switch 3 are electrically connected in series. The circuit breaker 1 and the disconnecting switch 2 can be switched on and off by the operation device 12 via operation rods 122a and 122b, respectively, both of which are penetrating through the first grounded container 15a.

Current transducers 21a and 21b are attached on both ends of the first hollow insulator 14a containing the circuit breaker 1. The current transducers 21a and 21b have current detecting means 22a and 22b, sensor units 23a and 23b, and power supply transformers 24a and 24b, respectively. A merging unit 25 is disposed on the supporting structure 17.

The features of the current transducers 21a and 21b, the sensor units 23a and 23b, and the merging unit 25 are same as those of the first embodiment described above, respectively.

The sensor unit 23b disposed on the higher voltage side and the sensor unit 23a disposed on the first grounded container 15a are connected with an optical fiber contained in an insulator tube 26, while the sensor unit 23a disposed on the first grounded container 15a and the merging unit 25 are connected with a conventional fiber optical cable 18.

According to this embodiment, the current transducer system can be applied to an integrated gas-insulated switchgear with grounded containers, and the same advantages are obtained in this embodiment as in the first embodiment. In addition, according to this embodiment, the optical fiber contained in the insulator tube 26 is needed to be installed only in a limited high voltage area because one end of the hollow insulator 14a is connected to the first grounded container 15a.

[Fourth Embodiment]

A fourth embodiment of an integrated gas-insulated switchgear with a current transducer system according to the present invention is now described with reference to FIG. 12. In this embodiment, an integrated gas-insulated switchgear 600 has a first grounded container 15a supported by a supporting structure 17.

The container 15a has first, second and third straight pipe portions 501, 502 and 503, respectively. The first and second pipe portions 501 and 502 are crossed and connected each other near their lower ends, while the third pipe portion 503 is branched from the second pipe portion 502 slightly above the crossing point of the first and second pipe portions 501 and 502.

The first pipe portion 501 is inclined. A first straight hollow insulator 14a is connected to the top end of the first pipe portion 501, and an operation device 12 is disposed at the bottom end of the first pipe portion 501, which are similar to those shown in FIG. 11. The first straight hollow insulator 14a contains a circuit breaker 1.

The second pipe portion 502 of the first grounded container 15a is vertically arranged, and is connected to a second grounded container 15b on the top end of the second pipe portion 502. A first disconnecting switch 2a is disposed in the second grounded container 15b. A first bushing 16a with a second straight hollow insulator 14b is connected to the top end of the second grounded container 15b.

The third pipe portion 503 is inclined opposite to the first pipe portion 501, and is connected to a third grounded container 15c on the top end of the third pipe portion 503. An earthing switch 3 is disposed in the third pipe portion 503. A second disconnecting switch 2b is disposed in the third grounded container 15c. A second bushing 16b with a third straight hollow insulator 14c is connected to the top end of the third grounded container 15c.

The first, second and third grounded containers 15a, 15b and 15c, the first, second and third hollow insulators 14a, 14b and 14c are filled with insulation gas. The gas filled spaces in the first hollow insulator 14a and the first grounded container 15a are divided by a first insulating spacer 153a. The gas filled spaces in the second grounded container 15b and the first grounded container 15a are divided by a second insulating spacer 153b. The gas filled spaces in the third grounded container 15c and the first grounded container 15a are divided by a third insulating spacer 153c.

The circuit breaker 1 and the first disconnecting switch 2a are electrically connected in series, and the circuit breaker 1, the earthing switch 3 and the second disconnecting switch 2b are electrically connected in series. The first disconnecting switch 2a, and the earthing switch 3 and the second disconnecting switch 2b are connected in parallel.

The circuit breaker 1 and the first and the second disconnecting switches 2a and 2b can be switched on and off by the operation device 12 via operation rods 122a, 122b and 122c, respectively, all of which are penetrating through the first grounded container 15a.

Figure 11:
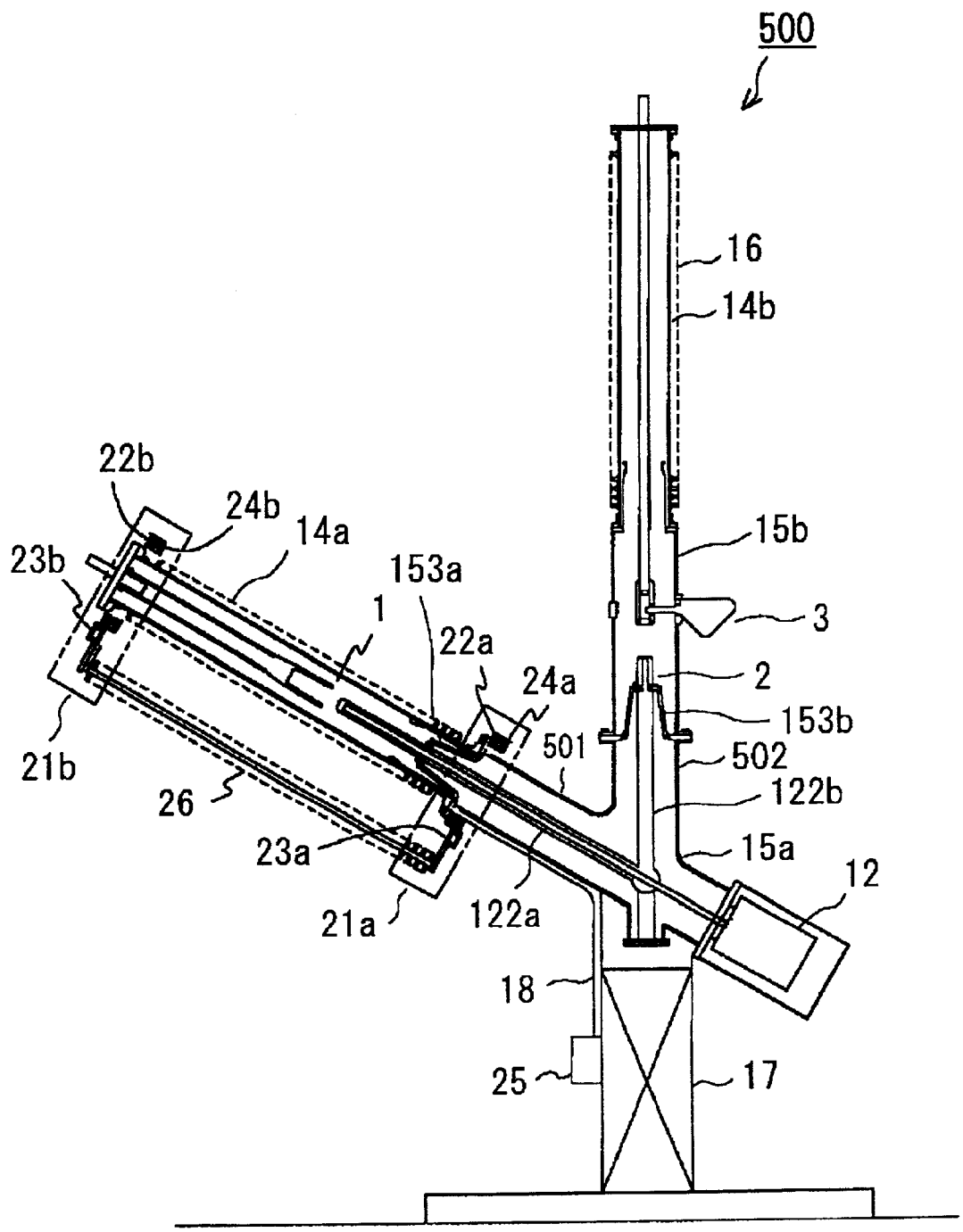
FIG. 11 is a schematic elevational cross-sectional view of a third embodiment of a gas-insulated switchgear according to the present invention.

Current transducers 21a and 21b are attached on both ends of the first hollow insulator 14a, and the current transducers 21a and 21b have current detecting means 22a and 22b, sensor units 23a and 23b, and power supply transformers 24a and 24b, respectively, in a similar way as in those shown in FIG. 11. A merging unit 25 is disposed on the supporting structure 17.

The sensor units 23b and 23a are connected with an optical fiber contained in an insulator tube 26, while the sensor unit 23a and the merging unit 25 are connected with a conventional fiber optical cable 18, in a similar way as in those shown in FIG. 11.

According to this embodiment, the current transducer system can be applied to an integrated gas-insulated switchgear with two disconnecting switches in grounded containers, and the same advantages are obtained in this embodiment as in the third embodiment.

[Fifth Embodiment]

Figure 13:
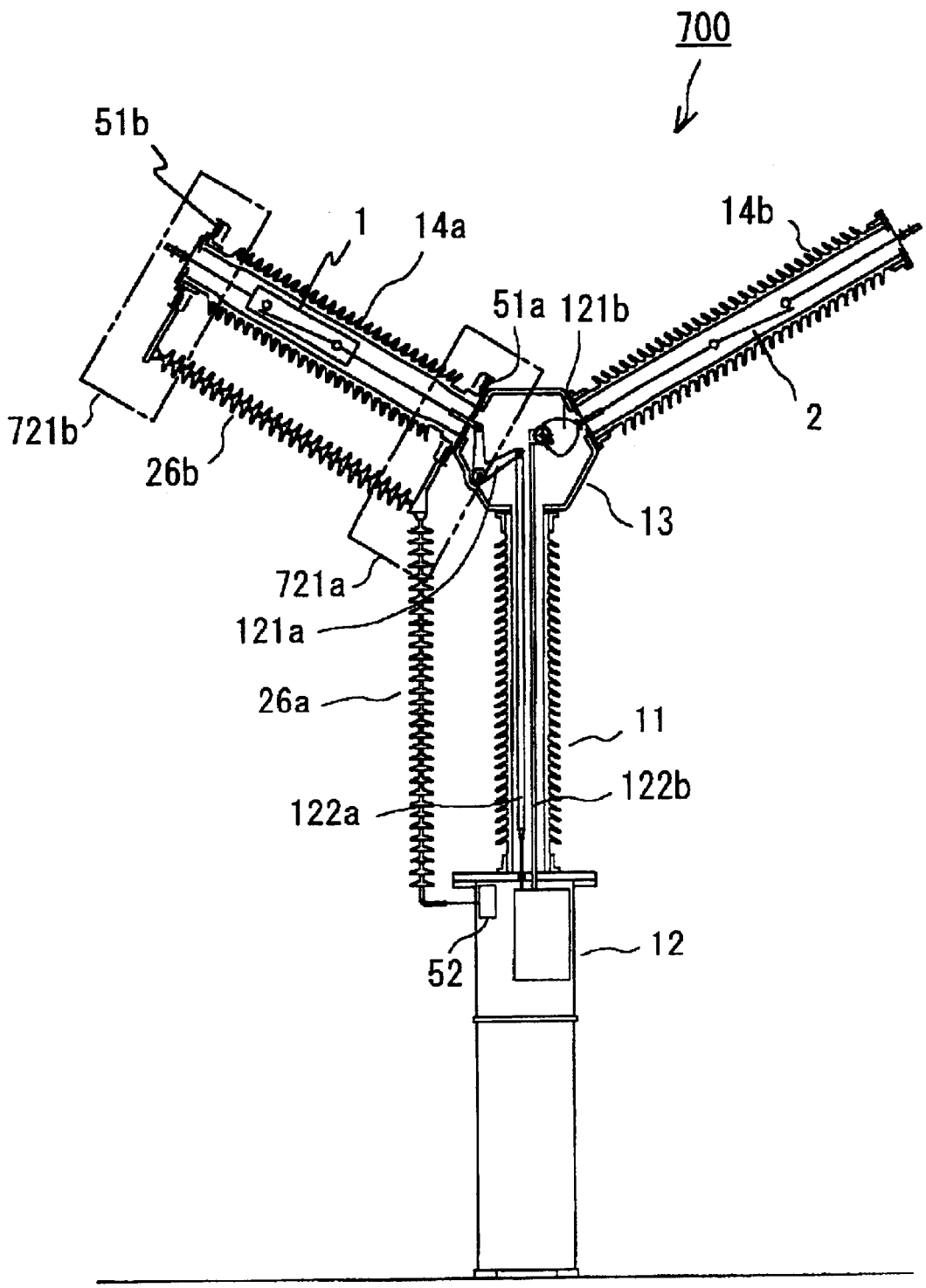
FIG. 13 is a schematic elevational cross-sectional view of a fifth embodiment of a gas-insulated switchgear according to the present invention.

A fifth embodiment of an integrated gas-insulated switchgear with a current transducer system according to the present invention is now described with reference to FIG. 13. In this embodiment, an integrated gas-insulated switchgear 700 is similar to the integrated gas-insulated switchgear 300 of the first embodiment shown in FIG. 5 except for current transducers 721a and 721b attached on both ends of the first hollow insulator 14a, and a sensor unit 52 disposed beside the operation device 12.

The current transducers 721a and 721b have optical current detecting means 51a and 51b, respectively, in place of the current detecting means 22a and 22b, and the power supply transformers 24a and 24b shown in FIG. 5. The optical current detecting means 51a and 51b utilize state of polarization of light in principle of optic Faraday's effect for detecting the AC currents.

The sensor unit 52 has functions of the sensor units 23 and of the merging units 25 shown in FIGS. 5–7. The optical current detecting means 51a and 51b output optic signals with variable state of polarization of light proportional to the high-voltage main circuit currents, and those optic signals are sent from the optical current detecting means 51a and 51b to the sensor unit 52 through the optical fibers contained in insulator tubes 26a and 26b.

The optic signals with variable state of polarization of light are converted to analog electric signals, which are then converted to digital electric signals by analog-to-digital converters (not shown) in the sensor unit 52. Then, the digital electric signals representing the outputs of the optical current detecting means 51a and 51b, which correspond to the high-voltage main circuit current, are merged into a series of transmission frames, which is then converted into a merged digital optic signal by an electric-to-optic converter (not shown) in the sensor unit 52. Then, the merged digital optic signal is sent out to the upstream system (not shown).

According to this embodiment, the current transducers 721a and 721b can be formed of only insulators (such as optical fiber current sensors). Besides, the sensor unit 52 can be disposed on ground potential. Therefore, electric power supply to the high voltage area is not required, and it is easy to install current transducers at the high voltage area. Besides, since the sensor unit 52 can be disposed on ground potential, the functions of the sensor units 23 and the merging unit 25 shown in FIGS. 6 and 7 can be integrated in a single sensor unit 52.

Figure 12:
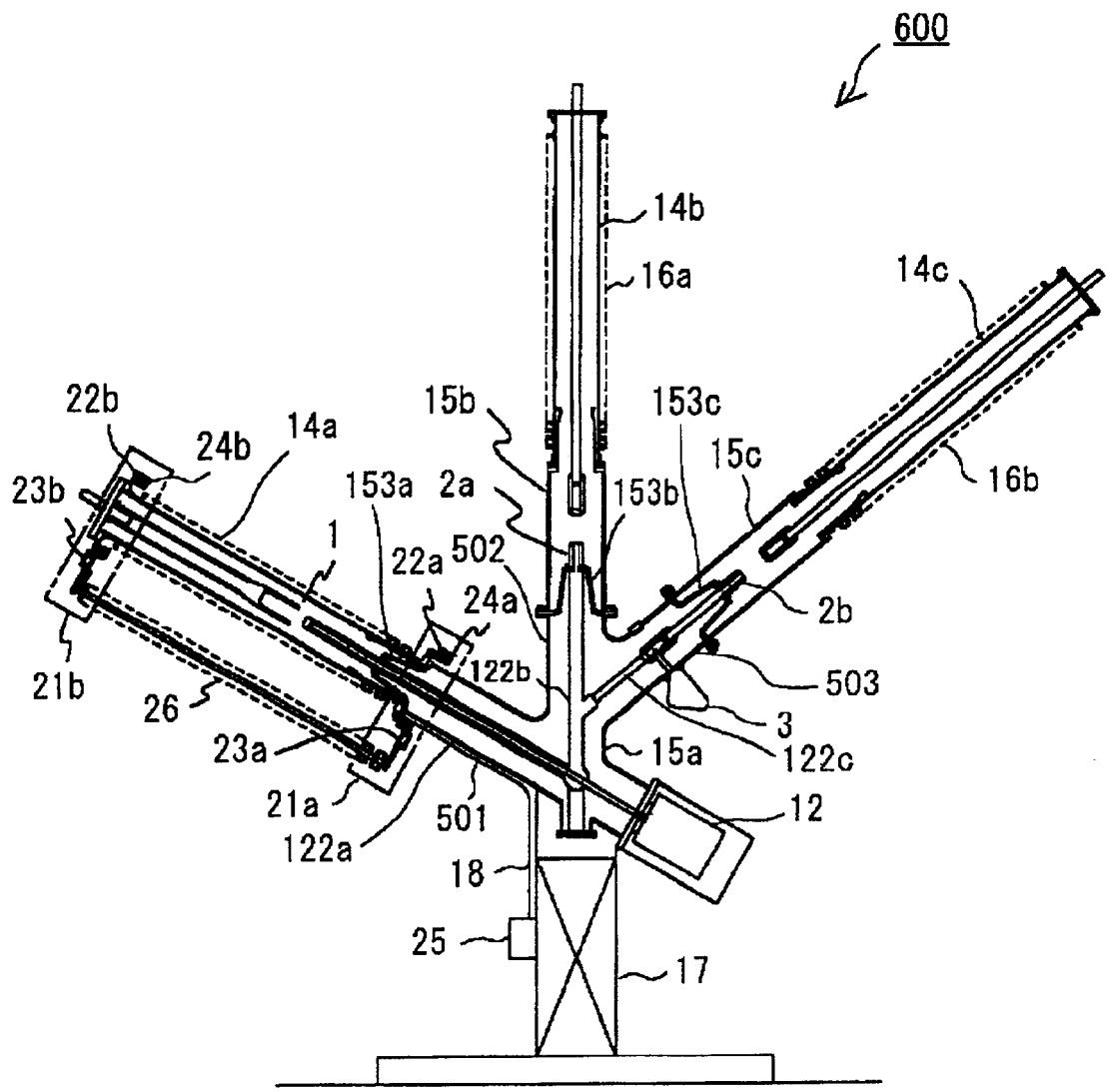
FIG. 12 is a schematic elevational cross-sectional view of a fourth embodiment of a gas-insulated switchgear according to the present invention.

The optical current detecting means 51a and 51b can be alternatively applied to the second, third and fourth embodiments shown in FIGS. 10, 11 and 12.

Numerous modifications and variations of the present invention are possible in light of the above teachings. It is, therefore, to be understood that, within the scope of the appended claims, the present invention can be practiced in a manner other than as specifically described herein.

What is claimed is:

1. A current transducer system for measuring AC current in a high-voltage main circuit having a circuit breaker and a disconnecting switch in an integrated gas-insulated switchgear, the system comprising:
   at least one current sensor for detecting the AC current and outputting an analog electric signal representing the AC current, the at least one current sensor disposed near the circuit breaker;
   at least one sensor unit including an analog-to-digital converter for converting the analog electric signal to a digital electric signal, and an electric-to-optic converter for converting the digital electric signal to a digital optic signal, the at least one sensor unit disposed adjacent the circuit breaker; and
   optic transmission means for transmitting the digital optic signal,
   wherein the integrated gas-insulated switchgear comprises:
     a metal container filled with insulating gas;
     a first hollow insulator connected to the metal container, the first hollow insulator being filled with insulating gas and containing the circuit breaker, the at least one current sensor and the at least one sensor unit being disposed at a non-grounded end of the first hollow insulator; and
     a second hollow insulator connected to the metal container, the second hollow insulator being filled with insulating gas and containing the disconnecting switch.

2. A current transducer system according to claim 1, the system including plurality of the current sensors, a plurality of the sensor units and a plurality of the optic transmission means, and the system further comprising:
   a merging unit for merging the digital optic signals transmitted from the current sensors via the sensor unit and the optic transmission means into at least one merged transmission signal and transmitting the at least one merged transmission signal to an upstream system.

3. A current transducer system according to claim 2, wherein the current sensors include two current sensors disposed on both sides of the circuit breaker.

4. A current transducer system according to claim 2, wherein the merging unit includes: a plurality of optic-to-electric converter for converting the optic signals to second digital electric signals; merging means for merging the second digital electric signals into at least one merged electric transmission signal; and a second electric-to-optic converter for converting the at least one merged electric transmission signal to at least one merged digital optic signal.

5. A current transducer system according to claim 1, the optic transmission means comprising an optical fiber covered with an insulator tube disposed outside of the integrated gas-insulated switchgear.

6. A current transducer system according to claim 1, wherein the at least one current sensor comprises a Rogowski coil including an insulator core and a coil or an air-core coil in principle of electric-magnetic coupling.

7. A current transducer system according to claim 1, wherein the at least one current sensor comprises a low power current transducer including an iron core, a coil and a current-detection resistor in principle of electric-magnetic coupling.

8. A current transducer system according to claim 1, further comprising power supply means for supplying electric power from the AC current in the high-voltage main circuit in the integrated gas-insulated switchgear to the at least one sensor unit.

9. A current transducer system according to claim 1, further comprising power supply means for receiving optic power and converting the optic power to electric power for the at least one sensor unit.

10. A current transducer system according to claim 1, further comprising first power supply means for supplying electric power to the at least one sensor unit in normal operation, and second power supply means for supplying electric power to the at least one sensor unit when the first power supply means is out of function, the second power supply means including a re-chargeable electric power storage.

11. A current transducer system for measuring AC current in a high-voltage main circuit having a circuit breaker and a disconnecting switch in an integrated gas-insulated switchgear, the circuit-breaker and the disconnecting switch being connected with each other in series,
    wherein the integrated gas-insulated switchgear comprises:
      an earthing switch connected with the circuit-breaker in series;
      a first grounded container filled with insulating gas;
      a hollow insulator connected to a first end of the first grounded container, the hollow insulator being filled with insulating gas and containing the circuit-breaker;
      at least one second grounded container connected to a second end of the first grounded container, the second end being opposite to the first end, the at least one second grounded container being filled with insulating gas and containing the disconnecting switch and the earthing switch; and
      at least one bushing insulator connected to an end of the second grounded container, the at least one bushing insulator being filled with insulating gas, the end of the second grounded container being further from the first grounded container, the system comprising:
        at least one current sensor for detecting the AC current and outputting an analog electric signal representing the AC current, the at least one current sensor disposed at an end of the hollow insulator further from the first grounded container;

at least one sensor unit including an analog-to-digital converter for converting the analog electric signal to a digital electric signal, and an electric-to-optic converter for converting the digital electric signal to a digital optic signal, the at least one sensor unit disposed at the end of the hollow insulator further from the first grounded container; and optic transmission means for transmitting the digital optic signal.

12. An integrated gas-insulated switchgear for switching on and off an AC current in a high-voltage main circuit, the switchgear comprising:
    (1) a container filled with insulating gas, the container including a metal container, and first and second hollow insulators connected to the metal container;
    (2) a circuit breaker and a disconnecting switch contained in the first and second hollow insulators, respectively, the circuit breaker and the disconnecting switch being connected in series with each other; and
    (3) a current transducer system for measuring the AC current in the high-voltage main circuit, the current transducer system including:
        at least one current sensor for detecting the AC current and outputting an analog electric signal representing the AC current, the at least one current sensor disposed at a non-grounded end of the first hollow insulator;
        at least one sensor unit including an analog-to-digital converter for converting the analog electric signal to a digital electric signal, and an electric-to-optic converter for converting the digital electric signal to a digital optic signal, the at least one sensor unit disposed at the non-grounded end of the first hollow insulator; and
        optic transmission means for transmitting the digital optic signal.

13. An integrated gas-insulated switchgear according to claim 12, wherein the current transducer system includes a plurality of the current sensors, a plurality of the sensor units and a plurality of the optic transmission means, and the system further comprises:
    a merging unit for merging the digital optic signals transmitted from the current sensors via the sensor units and the optic transmission means into at least one merged transmission signal and transmitting the at least one merged transmission signal to an upstream system.

14. A method for measuring AC current in a high-voltage main circuit having a circuit breaker and a disconnecting switch in an integrated gas-insulated switchgear, comprising: a metal container filled with insulating gas; a first hollow insulator connected to the metal container, the first hollow insulator being filled with insulating gas and containing a circuit breaker; at least one current sensor and at least one sensor unit disposed at a non-grounded end of the first hollow insulator; and a second hollow insulator connected to the metal container, the second hollow insulator being filled with insulating gas and containing a disconnecting switch, the method comprising steps of:
    detecting the AC current and outputting an analog electric signal representing the AC current near the circuit breaker;
    converting the analog electric signal to a digital electric signal and converting the digital electric signal to a digital optic signal near the circuit breaker; and
    transmitting the digital optic signal.

15. A method according to claim 14 comprising steps of:
    detecting the AC current and outputting a plurality of analog electric signals representing the AC current at a plurality of locations;
    converting the analog electric signals to a plurality of digital electric signals and converting the digital electric signals to a plurality of digital optic signals near the plurality of locations
    transmitting the digital optic signals; and
    merging the transmitted digital optic signals into at least one merged transmission signal; and
    transmitting the at least one merged transmission signal to an upstream system.

16. A current transducer system for measuring AC current in a high-voltage main circuit having a circuit breaker and a disconnecting switch in an integrated gas-insulated switchgear, the system comprising:
    a current transducer for detecting the AC current and outputting an optic signal representing the AC current, the current transducer disposed near the circuit breaker; and
    optic transmission means for transmitting the optic signal,
    wherein the integrated gas-insulated switchgear comprising:
        a metal container filled with insulating gas;
        a first hollow insulator connected to the metal container, the first hollow insulator being filled with insulating gas and containing the circuit breaker, at least one current sensor and at least one sensor unit being disposed at a non-grounded end of the first hollow insulator; and
        a second hollow insulator connected to the metal container, the second hollow insulator being filled with insulating gas and containing the disconnecting switch.

17. A current transducer system according to claim 16, wherein the current transducer detects the AC current based on state of polarization of light which is variable depending on the AC current.

18. A current transducer system according to claim 17, the system including a plurality of the current transducers and a plurality of the optic transmission means, and the system further comprising:
    a merging means for merging the optic signals transmitted from the optic transmission means into at least one merged transmission signal and transmitting the at least one merged transmission signal to an upstream system.

19. A current transducer system according to claim 18, wherein the optic signals are analog optic signals, and the system comprises a sensor unit including:
    a plurality of optic-to-electric converters for converting the optic signals to analog electric signals;
    at least one analog-to-digital converter for converting the analog electric signals to digital electric signals;
    merging means for merging the digital electric signals into at least one merged electric transmission signal; and
    an electric-to-optic converter for converting the at least one merged electric transmission signal to at least one digital optic signal.

* * * * *